US008487922B2

(12) United States Patent
Brown et al.

(10) Patent No.: US 8,487,922 B2

(45) Date of Patent: Jul. 16, 2013

(54) CAPACITIVE LOAD DRIVE CIRCUIT AND DISPLAY DEVICE INCLUDING THE SAME

(75) Inventors: Christopher Brown, Osaka (JP); Yasuyuki Ogawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 210 days.

(21) Appl. No.: 12/737,008

(22) PCT Filed: Jun. 2, 2009

(86) PCT No.: PCT/JP2009/060025

§ 371 (c)(1), (2), (4) Date: Dec. 1, 2010

(87) PCT Pub. No.: WO2010/018706

PCT Pub. Date: Feb. 18, 2010

(65) Prior Publication Data

US 2011/0074755 A1 Mar. 31, 2011

(30) Foreign Application Priority Data

Aug. 11, 2008 (JP) ................................ 2008-206610

(51) Int. Cl.

| | |
|---|---|
| ***G06F 3/038*** | (2006.01) |
| ***G09G 5/00*** | (2006.01) |
| ***G09G 3/38*** | (2006.01) |
| ***H03K 3/00*** | (2006.01) |
| ***H03K 3/64*** | (2006.01) |
| ***B23K 11/24*** | (2006.01) |
| ***H02J 7/00*** | (2006.01) |

(52) U.S. Cl.

USPC ............. 345/211; 307/108; 307/112; 345/94; 320/166

(58) Field of Classification Search

USPC ..................... 320/166; 327/108, 112; 345/94, 345/211

See application file for complete search history.

(56) References Cited

U.S. PATENT DOCUMENTS

| | | | | |
|---|---|---|---|---|
| 5,410,269 | A * | 4/1995 | Ohie et al. ...................... | 327/91 |
| 6,215,329 | B1 * | 4/2001 | Campardo et al. ............. | 326/88 |

(Continued)

FOREIGN PATENT DOCUMENTS

| | | |
|---|---|---|
| EP | 1 845 514 | 10/2007 |
| JP | H05-134627 | 5/1993 |

(Continued)

OTHER PUBLICATIONS

International Search Report.

*Primary Examiner* — Bipin Shalwala

*Assistant Examiner* — Matthew Fry

(74) *Attorney, Agent, or Firm* — Harness, Dickey & Pierce

(57) ABSTRACT

A buffer circuit drives a capacitive load based on a voltage Vin. In a setup period, switches are in an ON state, and in a drive period, a switch is in an ON state. A voltage comparison unit compares the voltage Vin in the setup period and a voltage Vout in a drive period to output a comparison result voltage. A push-pull output unit includes a TFT for charge and a TFT for discharge. A drive control unit controls the TFTs to be in an OFF state in the setup period, and in the drive period, selectively controls the TFTs to be in an ON state in accordance with the comparison result voltage. If Vout<Vin, the comparison result voltage rises, the TFT becomes in an ON state, a voltage at a node falls, the TFT becomes in the ON state, and the voltage Vout rises. Thus, there is a provided a small-sized capacitive load drive circuit with low power consumption and robust against process variation.

6 Claims, 8 Drawing Sheets

U.S. PATENT DOCUMENTS

| | | | | |
|---|---|---|---|---|
| 6,404,089 | B1 | 6/2002 | Tomion | |
| 7,164,298 | B2 * | 1/2007 | Sung | 327/112 |
| 7,274,254 | B2 * | 9/2007 | Hsieh | 330/51 |
| 7,521,971 | B2 * | 4/2009 | Yamazaki | 327/112 |
| 8,022,730 | B2 * | 9/2011 | Huang | 326/86 |
| 2002/0145408 | A1 | 10/2002 | Morita | |
| 2004/0095306 | A1 * | 5/2004 | Fujiyoshi | 345/94 |
| 2005/0140399 | A1 * | 6/2005 | Kim et al. | 327/108 |
| 2006/0152256 | A1 * | 7/2006 | Su | 327/112 |
| 2006/0220704 | A1 * | 10/2006 | Butler | 327/112 |
| 2007/0096565 | A1 | 5/2007 | Breed et al. | |
| 2009/0212828 | A1 | 8/2009 | Koji | |

FOREIGN PATENT DOCUMENTS

| | | |
|---|---|---|
| JP | 11-259052 | 9/1999 |
| JP | 2001-222261 | 8/2001 |
| JP | 2004-166039 | 6/2004 |
| JP | 2005-338131 | 12/2005 |
| JP | 2006-133444 | 5/2006 |
| JP | 2006-197541 | 7/2006 |
| JP | 2006-279512 | 10/2006 |
| RU | 2 268 542 | 6/2004 |
| RU | 2339158 | 11/2008 |

* cited by examiner

Conventional Art

Conventional Art

CAPACITIVE LOAD DRIVE CIRCUIT AND DISPLAY DEVICE INCLUDING THE SAME

TECHNICAL FIELD

The present invention relates to a capacitive load drive circuit that drives a capacitive load based on an input voltage, and a display device including a capacitive load drive circuit.

BACKGROUND ART

As one of methods for downsizing a liquid crystal display device and reducing power consumption of the same, there has been known a method of integrally forming pixel circuits and drive circuits of the pixel circuits on a same substrate. Hereinafter, the liquid crystal display device configured by this method will be referred to as a "driver-integrated liquid crystal display device". In the driver-integrated liquid crystal display device, the drive circuits are configured using thin film transistors (hereinafter, referred to as TFT (s)) made of low-temperature polysilicon, CG silicon (Continuous Grain silicon) or the like.

FIG. 7 is a block diagram showing a configuration of a conventional driver-integrated liquid crystal display device. The liquid crystal display device shown in FIG. 7 includes a liquid crystal panel 81 in which pixel circuits 82, a gate driver circuit 83, and a source driver circuit 84 are integrally formed on a glass substrate. The source driver circuit 84 includes a shift register 85, a D/A conversion circuit 86, a buffer circuit 87 and a sampling gate 88. The buffer circuit 87 drives a source line SL connected to the pixel circuit 82, based on an analog voltage Vin outputted from the D/A conversion circuit 86. The sampling gate 88 makes switching as to whether or not the buffer circuit 87 and the source line SL are to be connected. The sampling gate 88 is provided to disconnect the source line SL from the buffer circuit 87 and keep a voltage of the source line SL constant. Moreover, the sampling gate 88 is used to switch and drive the plurality of source lines SL. Switching and driving the plurality of source lines SL can decrease the D/A conversion circuits 86 and the buffer circuits 87 than the source lines SL in number.

FIG. 8 is a circuit diagram showing a part at subsequent stages of the D/A conversion circuit 86 of the liquid crystal display device shown in FIG. 7. In a circuit shown in FIG. 8, the buffer circuit 87 is configured using an operational amplifier 89. To a positive-side input terminal of the operational amplifier 89 is applied the analog voltage Vin outputted from the D/A conversion circuit 86. An output terminal of the operational amplifier 89 is feedback connected to a negative-side input terminal thereof. The operational amplifier 89 functions as a unity gain amplifier and makes control so that the voltage of the source line SL is equal to the analog voltage Vin.

FIG. 9 is a circuit diagram showing one example of the operational amplifier 89. The operational amplifier 89 shown in FIG. 9 includes TFTs M1 to M7 and a capacitor C1, and applies A class amplification to differential input voltages Vin+ and Vin− to generate an output voltage Vout. Performing the A class amplification in the operational amplifier 89 allows the source line SL to be driven based on the output voltage Vout with small distortion.

A technique relating to the invention of the present application is also described in the following documents. In Patent Document 1, an output stage circuit of a source driver circuit shown in FIG. 10 is described. The output stage circuit shown in FIG. 10 performs a three-stage operation of initial setting, writing and retaining in accordance with a timing chart shown in FIG. 11. States of switches SW7 to SW10 are changed in accordance with a high level or a low level of an output of a comparison circuit 92. In Patent Documents 2 to 4, other examples of the source driver circuit that drives the source line based on the input voltage are described.

RELATED DOCUMENTS

Patent Documents

[Patent Document 1] Japanese Laid-Open Patent Publication No. 2004-166039

[Patent Document 2] Japanese Laid-Open Patent Publication No. 2001-222261

[Patent Document 3] Japanese Laid-Open Patent Publication No. 2005-338131

[Patent Document 4] Japanese Laid-Open Patent Publication No. 2006-133444

DISCLOSURE OF THE INVENTION

Problems To Be Solved By the Invention

The source driver circuit of the driver-integrated liquid crystal display device has problems that it has large power consumption, is susceptible to process variation, has a large circuit area, and the like. For example, in the operational amplifier 89 shown in FIG. 9, in order to perform A class amplification, a bias current Ist steadily flows through the TFT M5 and the TFT M7. When the operational amplifier in which the steady current flows is used, the power consumption of the source driver circuit increases. Moreover, since an available common mode voltage in a differential amplifier circuit is limited, an operating voltage of the circuit needs to be made higher in order to exert desired performance while satisfying the limitation. However, when the operating voltage is made higher, the power consumption of the circuit increases. Moreover, since there are a capacitive component and a resistive component in the sampling gate, the electric power is also consumed in the sampling gate. For the above-described reasons, the source driver circuit disadvantageously has large power consumption.

Moreover, when the TFTs are formed on a glass substrate, variation (process variation) easily occurs in characteristics of the TFTs (e.g., threshold voltages). The variation of the threshold voltages of the TFTs will cause variation in the performance of the operational amplifier configured using the TFTs. Moreover, the bias voltage supplied to the operational amplifier will be varied. The performance of the source driver circuit varies for the above-described reasons, thereby causing linear nose in a display screen, which disadvantageously declines image quality of the display screen.

In order to prevent the image quality of the display screen from declining, a circuit to compensate for the process variation may be provided. The addition of the compensation circuit, however, poses a problem that a circuit area of the source driver circuit is increased by the addition. Moreover, the sampling gate and a control circuit thereof are provided in the source driver circuit, which also increases the circuit area.

Hence, an object of the present invention is to provide a small-sized capacitive load drive circuit with low power consumption, and robust against process variation, which is preferable for an output stage circuit of a source driver circuit in a driver-integrated display device or the like, and a display device including the same.

Means for Solving the Problems

According to a first aspect of the present invention, there is provided a capacitive load drive circuit that drives a capacitive load based on an input voltage, including: a voltage comparison unit that compares the input voltage inputted from an input terminal and an output voltage outputted from an output terminal to output a comparison result voltage in accordance with a comparison result; a drive control unit that outputs a charge control voltage and a discharge control voltage that are set to initial levels respectively in a first period, and change in accordance with the comparison result voltage in a second period; and a push-pull output unit including a charge circuit that charges the capacitive load connected to the output terminal, based on the charge control voltage, and a discharge circuit that discharges the capacitive load, based on the discharge control voltage, wherein the drive control unit selectively operates the charge circuit and the discharge circuit so that the output voltage becomes equal to the input voltage.

According to a second aspect of the present invention, in the first aspect of the present invention, the voltage comparison unit includes: an input-side selection switch that is provided between the input terminal and a predetermined node, and becomes in an ON state in the first period; an output-side selection switch that is provided between the output terminal and the node, and becomes in an ON state in the second period; and a comparison circuit whose input is connected to the node, the comparison circuit comparing the input voltage in the first period and the output voltage in the second period to output the comparison result voltage.

According to a third aspect of the present invention, in the second aspect of the present invention, the comparison circuit includes: an inverter circuit; a capacitive element provided between an input of the inverter circuit and the node; and a switch for short-circuit that is provided between the input and an output of the inverter circuit and becomes in an ON state in the first period, the capacitive element retains a difference between the input voltage and an inversion voltage of the inverter circuit in the first period, and in the second period, the inverter circuit outputs, as the comparison result voltage, a voltage in accordance with a voltage obtained by adding the inversion voltage to the difference between the output voltage and the input voltage.

According to a fourth aspect of the present invention, in the first aspect of the present invention, in the first period, the drive control unit sets the charge control voltage and the discharge control voltage to levels at which the charge circuit and the discharge circuit do not operate, respectively, and in the second period, based on the comparison result voltage, the drive control unit sets the charge control voltage to a level at which the charge circuit operates when the output voltage is lower than the input voltage, and sets the discharge control voltage to a level at which the discharge circuit operates when the output voltage is higher than the input voltage.

According to a fifth aspect of the present invention, in the fourth aspect of the present invention, the drive control unit includes: a charge-side amplifier circuit that outputs the charge control voltage to the charge circuit; and a discharge-side amplifier circuit that outputs the discharge control voltage to the discharge circuit.

According to a sixth aspect of the present invention, in the fifth aspect of the present invention, the drive control unit further includes: a charge-side capacitive element to capacitively-couple the output of the voltage comparison unit and an input of the charge-side amplifier circuit; a discharge-side capacitive element to capacitively-couple the output of the voltage comparison unit and an input of the discharge-side amplifier circuit; a charge-side setup switch that becomes in an ON state in the first period to supply an OFF voltage to the input of the charge-side amplifier circuit; and a discharge-side setup switch that becomes in an ON state in the first period to supply an OFF voltage to the input of the discharge-side amplifier circuit.

According to a seventh aspect of the present invention, in the first aspect of the present invention, as the charge circuit, the push-pull output unit includes a switch for charge that is provided between a high voltage-side power supply line and the output terminal, and is controlled using the charge control voltage, and as the discharge circuit, the push-pull output unit includes a switch for discharge that is provided between a low voltage-side power supply line and the output terminal, and is controlled using the discharge control voltage.

According to an eighth aspect of the present invention, in the seventh aspect of the present invention, the push-pull output unit further includes: a switch for charge stop that is provided between the high voltage-side power supply line and the output terminal in series with the switch for charge; and a switch for discharge stop that is provided between the low voltage-side power supply line and the output terminal in series with the switch for discharge.

According to a ninth aspect of the present invention, there is provided a display device that drives a signal line connected to a pixel circuit using a capacitive load drive circuit according to any one of the first to eighth aspects of the present invention.

Effects of the Invention

According to the first aspect of the present invention, by selectively operating the charge circuit and the discharge circuit included in the push-pull output unit, based on the result from comparing the input voltage and the output voltage to perform the charge and discharge of the capacitive load, the output voltage and the input voltage can be made equal. Moreover, selectively operating the charge circuit and the discharge circuit can prevent a steady current from flowing in the circuit, and thus, power consumption of the circuit can be reduced. Moreover, performing the charge and discharge of the capacitive load only when the output voltage is not equal to the input voltage can prevent wasteful power consumption by the charge and discharge of the capacitive load. Since in the second period, the output voltage is controlled to be equal to the input voltage, no circuit to retain the output voltage (e.g., a sampling gate) is required, by which an area and power consumption of the circuit can be reduced. For the voltage comparison unit, the drive control unit and the push-pull output unit, circuits robust against the process variation can be configured easily. Accordingly, a small-sized capacitive load drive circuit with low power consumption and robust against the process variation can be configured.

According to the second aspect of the present invention, by preferably controlling the states of the two switches, the voltage inputted to the comparison circuit is switched between in the first period and in the second period, and using the comparison circuit, the comparison result voltage in accordance with the comparison result between the input voltage in the first period and the output voltage in the second period can be found.

According to the third aspect of the present invention, in the comparison circuit including the capacitive element, the inverter circuit and the switch, by preferably controlling the state of the switch, the inverter circuit, in the second period, outputs the voltage in accordance with the voltage obtained by adding the inversion voltage of the inverter circuit (the input/output voltage when the input and the output of the inverter circuit are short-circuited) to the difference between the output voltage and the input voltage. When the voltage outputted from the inverter circuit is used as the comparison result voltage, the charge control voltage and the discharge control voltage are not affected by variation of a threshold voltage of the inverter circuit. Accordingly, the output voltage can be made equal to the input voltage without being affected by the variation of the threshold voltage of the inverter circuit. Consequently, the capacitive load drive circuit robust against the process variation can be configured.

According to the fourth aspect of the present invention, in the first period, the charge circuit and the discharge circuit are stopped, and in the second period, the charge circuit is operated when the output voltage is lower than the input voltage, and the discharge circuit is operated when the output voltage is higher than the input voltage, by which while unchanging the output voltage in the first period, the output voltage can be made equal to the input voltage in the second period.

According to the fifth aspect of the present invention, using the two amplifier circuits allows the drive control unit to be easily configured, in which in the first period, the charge control voltage and the discharge control voltage are set to the respective initial levels, and in the second period, the charge control voltage and the discharge control voltage are changed in accordance with the comparison result voltage.

According to the sixth aspect of the present invention, in the first period, the two setup switches are put into the ON state to supply the OFF voltage to the inputs of the respective amplifier circuits, by which the charge control voltage and the discharge control voltage can be set to the respective initial levels. In the second period, the two setup switches are put into the OFF state to supply the comparison result voltage to the inputs of the respective amplifier circuits through the capacitive elements, by which the charge control voltage and the discharge control voltage can be changed in accordance with the comparison result voltage.

According to the seventh aspect of the present invention, the switches are provided between the two types of power supply line and the output terminal, respectively, and are controlled using the charge control voltage and the discharge control voltage, thereby enabling the push-pull output unit to be easily configured, the push-pull output unit including the charge circuit that charges the capacitive load based on the charge control voltage, and the discharge circuit that discharges the capacitive load based on the discharge control voltage. Using this push-pull output unit can prevent a steady current to flow in the circuit, thus reducing the power consumption of the circuit.

According to the eighth aspect of the present invention, the switches are added between the two types of power supply line and the output terminal, respectively and the states of the added switches are preferably controlled, by which a period when the charge and discharge of the capacitive load are performed is limited, so that malfunction of the circuit can be prevented, and the power consumption can be reduced.

According to the ninth aspect of the present invention, when the signal line connected to the pixel circuit is driven, using the small-sized capacitive load drive circuit with low power consumption and robust against the process variation enables a small-sized display device with low power consumption and high image quality to be configured.

MODE FOR CARRYING OUT THE INVENTION

Figure 1:
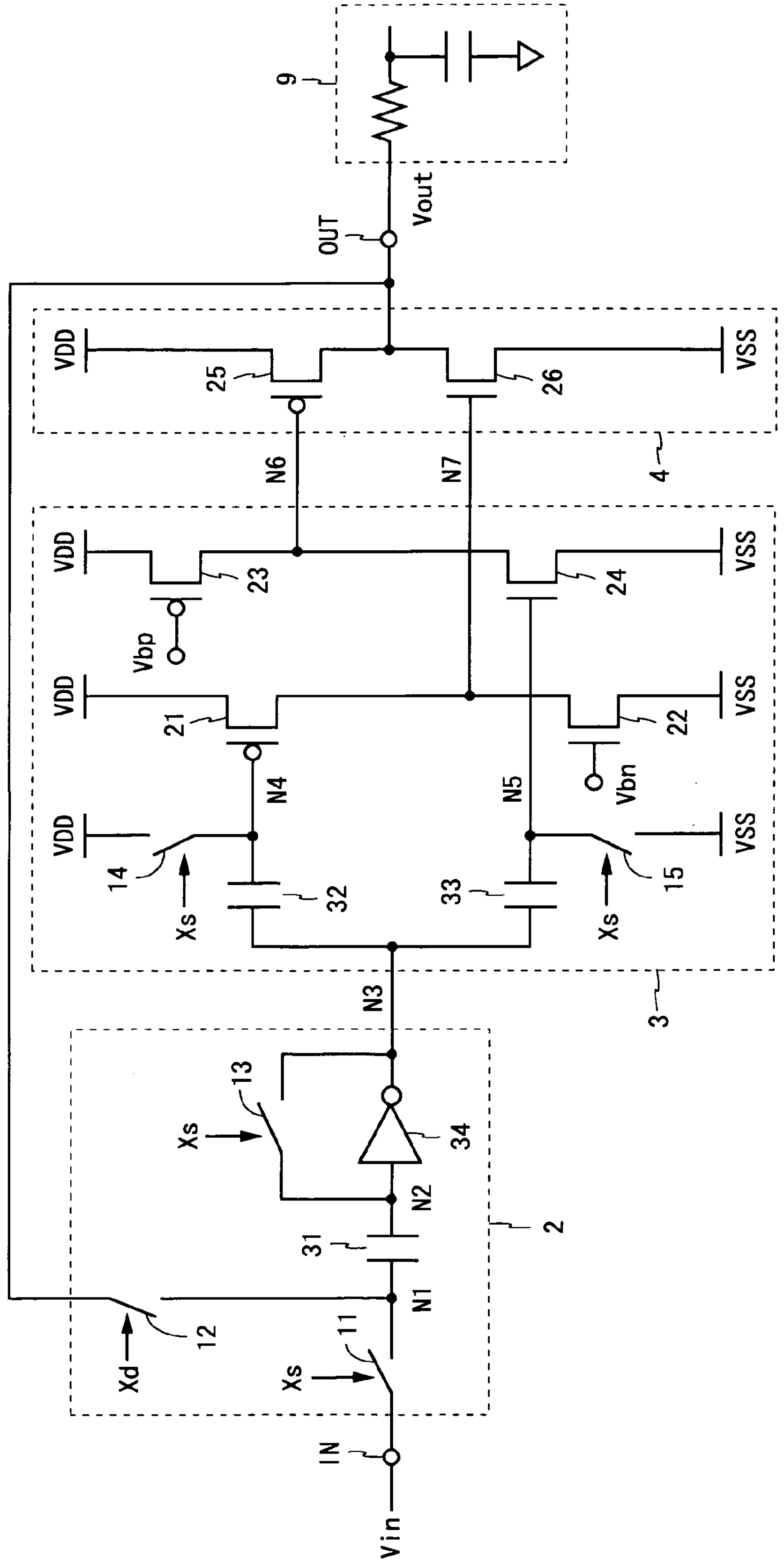
FIG. 1 is a circuit diagram of a push-pull type buffer circuit according to an embodiment of the present invention.

FIG. 1 is a circuit diagram of a push-pull type buffer circuit according to an embodiment of the present invention. A buffer circuit 1 shown in FIG. 1 is one specific example of a capacitive load drive circuit of the present invention, and drives a capacitive load 9 connected to an output terminal OUT, based on a voltage inputted from an input terminal IN. Hereinafter, the voltage inputted from the input terminal IN is referred to as an input voltage Vin, and a voltage outputted from the output terminal OUT is referred to as an output voltage Vout.

Figure 2:
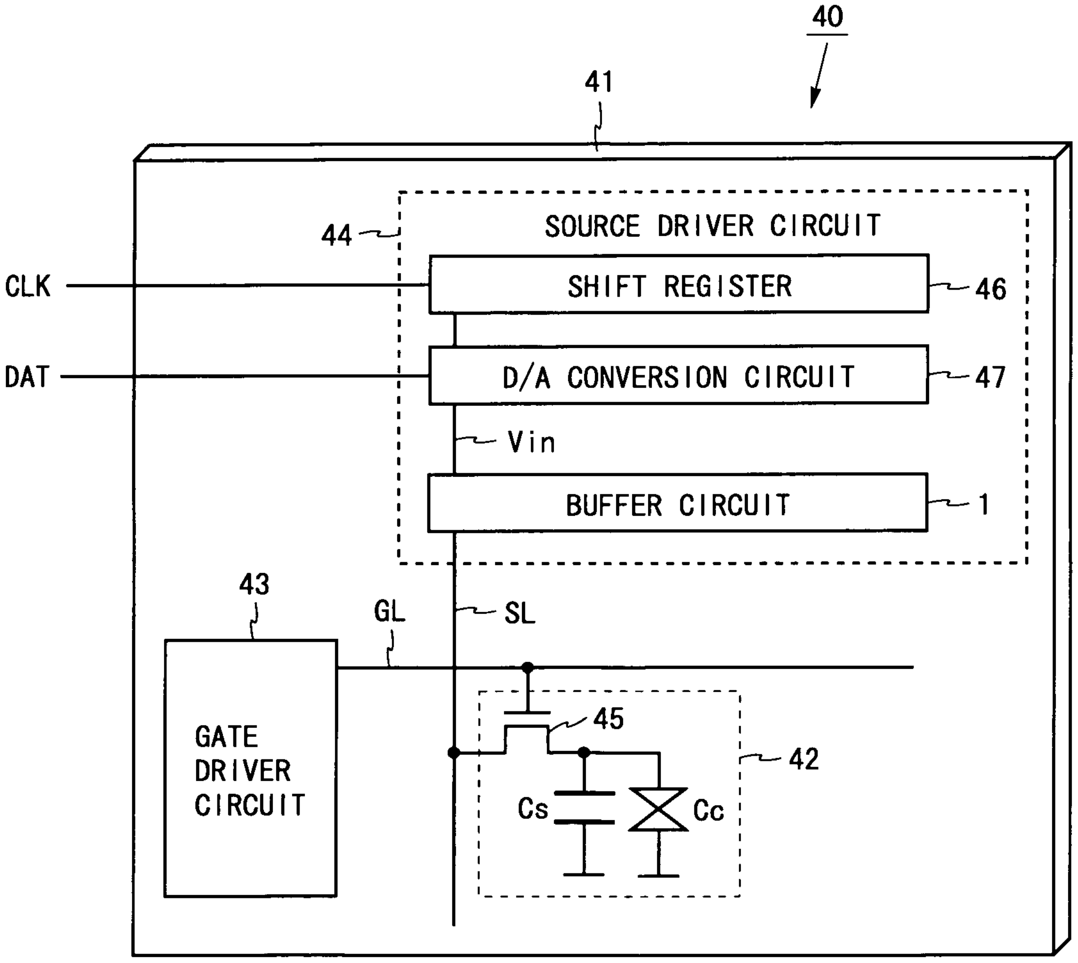
FIG. 2 is a block diagram showing a configuration of a driver-integrated liquid crystal display device including the buffer circuit shown in FIG. 1.

The buffer circuit 1 is used, for example, as an output stage circuit of a source driver circuit that drives a source line (also referred to as a data signal line, a video signal line or the like) in a driver-integrated liquid crystal display device (a liquid crystal display device in which pixel circuits and drive circuits thereof are integrally formed on the same substrate). FIG. 2 is a block diagram showing a configuration of the driver-integrated liquid crystal display device including the buffer circuit 1. A liquid crystal display device 40 shown in FIG. 2 includes a liquid crystal panel 41 in which pixel circuits 42, a gate driver circuit 43 and a source driver circuit 44 are integrally formed on a glass substrate. The circuits on the glass substrate are configured using TFTs made of low-temperature polysilicon, CG silicon or the like.

In the liquid crystal panel 41, a plurality of gate lines GL parallel to one another and the plurality of source lines SL perpendicular to the gate lines GL and parallel to one another are formed (one gate line GL and one source line SL are shown in FIG. 2). Corresponding to respective intersections of the gate lines GL and the source lines SL, the pixel circuits 42 each including a TFT 45, a liquid crystal capacitance Cc and an auxiliary capacitance Cs are formed. Each of the pixel circuits 42 is connected to the corresponding gate line GL and source line SL.

Furthermore, in the liquid crystal panel 41, as the drive circuits of the pixel circuits 42, the gate driver circuit 43 and the source driver circuit 44 are formed. The gate driver circuit 43 selects one gate line among the plurality of gate lines GL. The source driver circuit 44 applies, to the source lines SL, voltages to be written into the pixel circuits 42 connected to the selected gate line GL. The source driver circuit 44 includes a shift register 46, a D/A conversion circuit 47 and the buffer circuit 1 according to the present embodiment. The D/A conversion circuit 47 converts digital video data DAT supplied from outside the liquid crystal display device 40 to the analog voltage Vin. The buffer circuit 1 is connected to the source line SL, which is a capacitive load, to drive the source line SL based on the analog voltage Vin outputted from the D/A conversion circuit 47. Since the buffer 1 has a function of making switching as to whether or not the source line SL is to be connected, the source driver circuit 44 including the buffer circuit 1 need not be provided with a sampling gate.

Hereinafter, referring to FIG. 1, a detailed description of the buffer circuit 1 is given. As shown in FIG. 1, the buffer circuit 1 includes a voltage comparison unit 2, a drive control unit 3 and a push-pull output unit 4. These circuits are configured using switches 11 to 15, TFTs 21 to 26, capacitors 31 to 33 and an inverter circuit 34. The TFTs 21, 23 and 25 are P type TFTs and the TFTs 22, 24 and 26 are N type TFTs.

The voltage comparison unit 2 includes the switches 11 to 13, and the capacitor 31 and the inverter circuit 34. The switch 11 is provided between the input terminal IN and one electrode of the capacitor 31 (electrode on the left side in FIG. 1. Hereinafter, referred to as an input-side electrode). The switch 12 is provided between the output terminal OUT and the input-side electrode of the capacitor 31. The other electrode of the capacitor 31 is connected to an input of the inverter circuit 34. The switch 13 is provided between the input and an output of the inverter circuit 34. The switch 13, the capacitor 31 and the inverter circuit 34 configure a comparison circuit that compares two voltages sequentially inputted.

The drive control unit 3 includes the switches 14 and 15, the TFTs 21 to 24 and the capacitors 32 and 33. The TFTs 21 and 22 are connected in series, and arranged between a high voltage-side power supply line and a low voltage-side power supply line (hereinafter, the former is referred to as a VDD line and the latter is referred to as a VSS line). More particularly, drain terminals of the TFTs 21 and 22 are connected to each other, and source terminals of the TFTs 21 and 22 are connected to the VDD line and the VSS line, respectively. A predetermined bias voltage Vbn is applied to a gate terminal of the TFT 22, and the TFT 22 functions as a bias transistor. The capacitor 32 is provided between the output of the inverter circuit 34 and a gate terminal of the TFT 21. The switch 14 is provided between the VDD line and the gate terminal of the TFT 21. In this manner, the TFTs 21 and 22 configure an amplifier circuit (hereinafter, referred to as a discharge-side amplifier circuit), and an input of the discharge-side amplifier circuit is capacitively-coupled to an output of the voltage comparison unit 2.

The TFTs 23 and 24 are, similarly to the TFTs 21 and 22, connected in series and arranged between the VDD line and the VSS line. The predetermined bias voltage Vbp is applied to a gate terminal of the TFT 23 and the TFT 23 functions as a bias transistor. The capacitor 33 is provided between the output of the inverter circuit 34 and a gate terminal of the TFT 24. The switch 15 is provided between the VSS line and the gate terminal of the TFT 24. In this manner, the TFTs 23 and 24 configure an amplifier circuit (hereinafter, referred to as a charge-side amplifier circuit), and an input of the charge-side amplifier circuit is capacitively-coupled to the output of the voltage comparison unit 2.

The push-pull output unit 4 includes the TFTs 25 and 26. The TFT 25 and 26 are, similarly to the TFTs 21 and 22, connected in series and arranged between the VDD line and the VSS line. A gate terminal of the TFT 25 is connected to drain terminals of the TFTs 23 and 24, a gate terminal of the TFT 26 is connected to the drain terminals of the TFTs 21 and 22. Drain terminals of the TFTs 25 and 26 are connected to the output terminal OUT. In this manner, the TFT 25 is provided between the VDD line and the output terminal OUT, and the TFT 26 is provided between the VSS line and the output terminal OUT.

In the buffer circuit 1, the switches 11 to 15 function as an input-side selection switch, an output-side selection switch, a switch for short-circuit, a discharge-side setup switch and a charge-side setup switch, respectively. The capacitor 32 functions as a discharge-side capacitive element, and the capacitor 33 functions as a charge-side capacitive element. The TFT 25 functions as a switch for charge, and the TFT 26 functions as a switch for discharge. The switch for charge configures a charge circuit, and the switch for discharge configures a discharge circuit.

The switches 11 and 13 to 15 are supplied with a switch control signal Xs and the switch 12 is supplied with a switch control signal Xd. The switches 11 to 15 become in an ON state when the supplied switch control signals are each at a high level, and become in an OFF state when the signals are each at a low level. Hereinafter, a node where the switches 11 and 12 and the capacitor 31 are connected is referred to as N1, a node where the input of the inverter circuit 34 is connected is referred to as N2, a node where the output of the inverter circuit 34 is connected is referred to as N3, and nodes where the gate terminals of the TFTs 21, 24, 25 and 26 are connected are referred to as N4 to N7, respectively.

The buffer circuit 1 performs a two-step operation of setup and drive to thereby drive the capacitive load 9. Hereinafter, a period when the setup operation is performed is referred to as a "setup period", and a period when the drive operation is performed is referred to as a "drive period". In the setup period, the switch control signal Xs is controlled to be at the high level, and the switch control signal Xd is controlled to be at the low level. Accordingly, in the setup period, the switches 11 and 13 to 15 are in the ON state, and the switch 12 is in the OFF state (see FIG. 3). On the other hand, in the drive period, the switch control signal Xs is controlled to be at the low level, and the switch control signal Xd is controlled to be at the high level. Accordingly, in the drive period, the switches 11 and 13 to 15 are in the OFF state, and the switch 12 is in the ON state (see FIG. 4).

Figure 5:
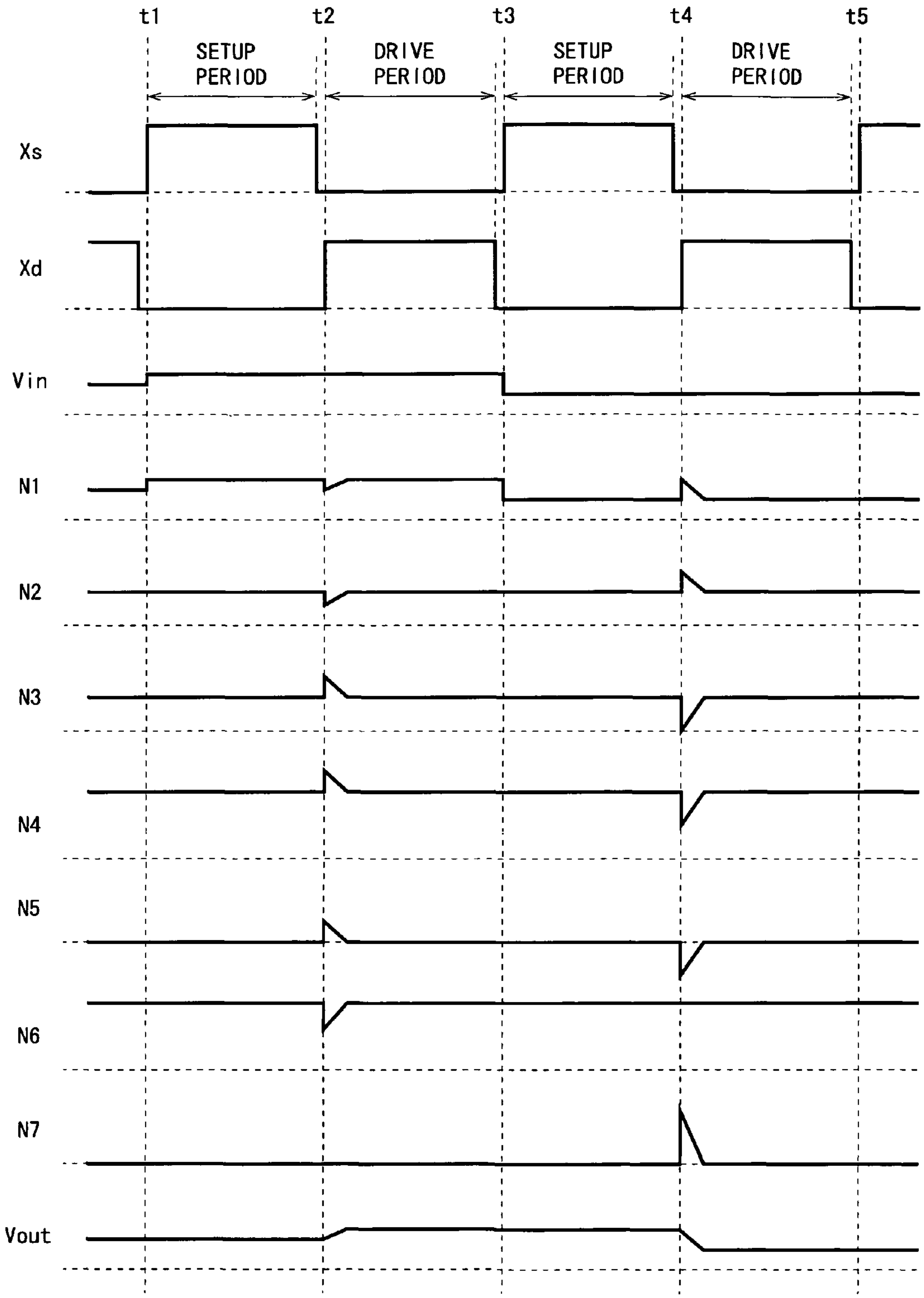
FIG. 5 is a timing chart of the buffer circuit shown in FIG. 1.

FIG. 5 is a timing chart of the buffer circuit 1. In FIG. 5, changes of the switch control signals Xs, Xd, the input voltage Vin, voltages at the nodes N1 to N7, and the output voltage Vout are shown. The period when the switch control signal Xs is at the high level is the setup period, and the period when the switch control signal Xd is at the high level is the drive period. The setup period and the drive period are set so as not to overlap each other. Moreover, in order to prevent malfunction of the buffer circuit 1, a little vacant time is provided between the setup period and the drive period.

In the example shown in FIG. 5, the input voltage Vin rises at time t1, and falls at time t3. The buffer circuit 1 performs a setup operation to initialize a state of the circuit in the setup period starting at the time t1. In the drive period starting at time t2, the buffer circuit 1 performs a drive operation in which the capacitive load 9 is charged to make the output voltage Vout rise. In the setup period starting at the time t3, the buffer circuit 1 performs the same setup operation as that in the setup period starting at the time t1. In the drive period starting at time t4, the buffer circuit 1 performs a drive operation in which the capacitive load 9 is discharged to make the output voltage Vout fall. Hereinafter, the operations of the buffer circuit 1 in the respective periods are described in detail.

Figure 3:
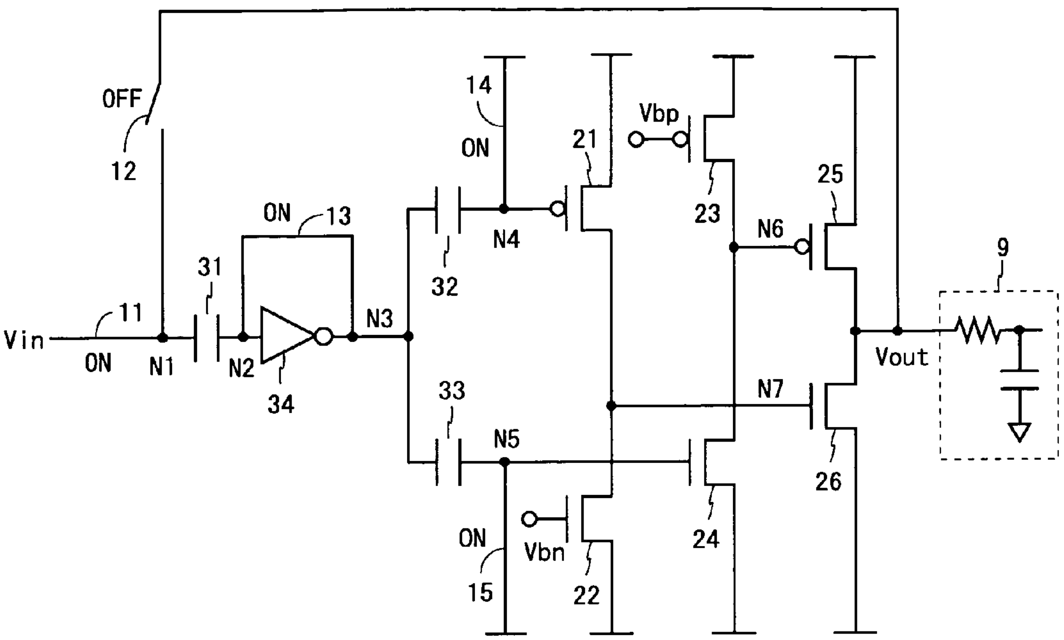
FIG. 3 is a diagram showing a state of switches in a setup period of the buffer circuit shown in FIG. 1.

Since in the setup period starting at the time t1 or at the time t3, the switch control signal Xs is controlled to be at the high level, and the switch control signal Xd is controlled to be at the low level, the switches 11 and 13 to 15 become in the ON state and the switch 12 becomes in the OFF state (see FIG. 3). Since the switch 11 is in the ON state and the switch 12 is in the OFF state, the input voltage Vin is applied to the input-side electrode of the capacitor 31 through the switch 11, so that the voltage at the node N1 becomes equal to the input voltage Vin.

Moreover, since the switch 13 is in the ON state, the input and the output of the inverter circuit 34 are short-circuited, and an input voltage and an output voltage of the inverter circuit 34 become equal. An input/output voltage of the inverter circuit 34 when the input and the output are short-circuited is referred to as an inversion voltage Vm. In the setup period, the voltages at the nodes N2 and N3 become equal to the inversion voltage Vm and an inter-electrode voltage of the capacitor 31 becomes (Vin−Vm). The capacitor 31 retains the inter-electrode voltage at the end of the setup period.

Moreover, since the switches 14 and 15 are in the ON state, a power supply voltage on the high voltage side (hereinafter, referred to as VDD) is supplied to the node N4 from the VDD line, and a power supply voltage on the lower voltage side (hereinafter, referred to as VSS) is supplied to the node N5 from the VSS line. Thus, an inter-electrode voltage of the capacitor 32 becomes (VDD−Vm) and an inter-electrode voltage of the capacitor 33 becomes (VSS−Vm). The capacitors 32 and 33 retain the respective inter-electrode voltages at the end of the setup period.

The TFT 24 becomes in an OFF state because the voltage VSS is applied to the gate terminal thereof. At this time, a voltage at the node N6 is pulled up by the TFT 23 to be higher than a threshold voltage of the TFT 25. Moreover, the TFT 21 becomes in an OFF state because the voltage VDD is applied to the gate terminal thereof. At this time, a voltage at the node N7 is pulled down by the TFT 22 to be lower than a threshold voltage of the TFT 26. Accordingly, in the setup period, since both of the TFTs 25 and 26 become in an OFF state, which puts the output of the buffer circuit 1 into a floating state, so that the output voltage Vout is not changed.

Figure 4:
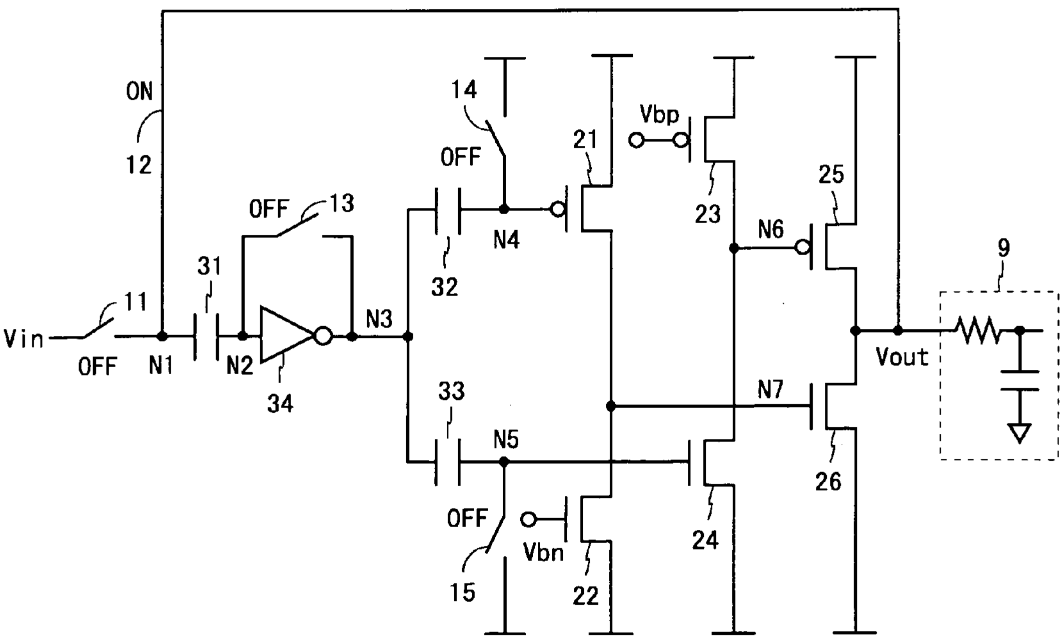
FIG. 4 is a diagram showing a state of the switches in a drive period of the buffer circuit shown in FIG. 1.

In the drive period stating at the time t2, since the switch control signal Xs is controlled to be at the low level, and the switch control signal Xd is controlled to be at the high level, the switches 11 and 13 to 15 become in the OFF state and the switch 12 becomes in the ON state (see FIG. 4). Since the switch 11 is in the OFF state and the switch 12 is in the ON state, the output voltage Vout is applied to the input-side electrode of the capacitor 31 through the switch 12, so that the voltage at the node N1 becomes equal to the output voltage Vout. In this manner, the voltage at the node N1 falls from Vin to Vout at the time t2.

Moreover, at the time t2 and later, the switch 13 is in the OFF state. The voltage retained in the capacitor 31 does not change before and after the time t2, and thus, when the voltage at the node N1 falls from Vin to Vout, a voltage at the node N2 falls by the same amount to be (Vout−Vin+Vm). Once the voltage at the node N2 falls, a voltage at the node N3 to which the output of the inverter circuit 34 is connected rises. Generally, the output voltage of the inverter circuit changes more largely than the input voltage when the input voltage changes in the vicinity of the inversion voltage Vm. Accordingly, in accordance with the fall amount (Vout−Vin+Vm) of the voltage at the node N2, the voltage at the node N3 rises more largely than the fall amount of the voltage at the node N2.

Moreover, at the time t2 and later, the switches 14 and 15 are in the OFF state. The voltages retained in the capacitors 32 and 33 do not change before and after the time t2, and thus, once the voltage at the node N3 rises, with this, the voltages at the nodes N4 and N5 rise by the same amount, respectively. When the voltage at the node N5 rises, the TFT 24 becomes in an ON state, the voltage at the node N6 falls, and the TFT 25 becomes in an ON state. On the other hand, even when the voltage at the node N4 rises, the TFTs 21 and 26 remain in the OFF state. In this manner, since the TFT 25 changes to the ON state and the TFT 26 retains the OFF state, the capacitive load 9 is connected to the VDD line through the TFT 25. As a result, the capacitive load 9 is charged, so that the output voltage Vout rises.

The output voltage Vout continues to rise, until it becomes equal to the input voltage Vin. Once the output voltage Vout becomes equal to the input voltage Vin, the voltages at the nodes N1 to N7 return to the levels in the setup period. For example, the voltages at the nodes N2 and N3 become equal to the inversion voltage Vm, and the voltages at the nodes N4 and N5 become equal to the VDD and the VSS, respectively. Accordingly, when the output voltage Vout becomes equal to the input voltage Vin, the TFTs 24 and 25 return to the OFF state, so that the output voltage Vout stops to rise.

In the drive period starting at the time t4, the switches 11 to 15 are in the same state as that in the drive period starting at the time t2 (see FIG. 4). Since the switch 11 is in the OFF state and the switch 12 is in the ON state, the voltage at the node N1 becomes equal to the output voltage Vout. In this manner, the voltage at the node N1 rises from Vin to Vout at the time t4.

When the voltage at the node N1 rises from Vin to Vout, the voltage at the node N2 rises by the same amount to be (Vout−Vin+Vm), and the voltage at the node N3 connected to the output of the inverter circuit 34 falls. When the voltage at the node N3 falls, with this, the voltages at nodes N4 and N5 fall by the same amount, respectively. When the voltage at the node N4 falls, the TFT 21 becomes in an ON state, the voltage at the node N7 rises, and the TFT 26 becomes in an ON state. On the other hand, even when the voltage at the node N5 falls, the TFT 24 remains in the OFF state, and the TFT 25 also remains in the OFF state. In this manner, since the TFT 26 changes to the ON state and the TFT 25 remains in the OFF state, the capacitive load 9 is connected to the VSS line through the TFT 26. As a result, the capacitive load 9 is discharged, so that the output voltage Vout falls.

The output voltage Vout continues to fall until it becomes equal to the input voltage Vin. Once the output voltage Vout becomes equal to the input voltage Vin, the voltages at the nodes N1 to N7 return to the levels in the setup period. Accordingly, when the output voltage Vout becomes equal to the input voltage Vin, the TFTs 21 and 26 return to the OFF state, the output voltage Vout stops to fall.

Here, the voltage outputted from the voltage comparison unit 2 to the drive control unit 3 (the voltage at the node N3) is referred to as a "comparison result voltage", and among the voltages outputted from the drive control unit 3 to the push-pull output unit 4, the voltage applied to the gate terminal of the TFT 25 (voltage at the node N6) is referred to as a "charge control voltage", and the voltage applied to the gate terminal of the TFT 26 (voltage at the node N7) is referred to as a "discharge control voltage". Using these terms, the configuration and the operation of the buffer circuit 1 can be described as below.

The voltage comparison unit 2 includes a comparison circuit configured by the switch 13, the capacitor 31 and the inverter circuit 34, the switch 11 as the input-side selection switch, and the switch 12 as the output-side selection switch.

In the setup period, the switches 11 and 13 are in the ON state, and the capacitor 31 retains the inter-electrode voltage (Vin−Vm). In the drive period, the switch 12 is in the ON state, and the inverter circuit 34 outputs the comparison result voltage in accordance with the voltage at the node N2 (Vout−Vin+Vm). The comparison result voltage becomes higher than the inversion voltage Vm when the output voltage Vout is lower than the input voltage Vin, and becomes lower than the inversion voltage Vm when the output voltage Vout is higher than the input voltage Vin. In this manner, the voltage comparison unit 2 compares the input voltage Vin inputted from the input terminal IN and the output voltage Vout outputted from the output terminal OUT to output the comparison result voltage in accordance with the comparison result. The comparison circuit included in the voltage comparison unit 2 compares the input voltage Vin in the setup period and the output voltage Vout in the drive period to output the comparison result voltage.

The drive control unit 3 includes the charge-side amplifier circuit configured by the TFTs 23 and 24, the discharge-side amplifier circuit configured by the TFTs 21 and 22, the capacitor 33 as the charge-side capacitive element, the capacitor 32 as the discharge-side capacitive element, the switch 15 as the charge-side setup switch, and the switch 14 as the discharge-side setup switch. In the setup period, the switches 14 and 15 become in the ON state, so that OFF voltages (voltages at which TFTs 21 and 24 become in the OFF state) are supplied to the two amplifier circuits. At this time, the charge control voltage is enough high for the TFT 25 to be in the OFF state, and the discharge control voltage is enough low for the TFT 26 to be in the OFF state. In the drive period, the switches 14 and 15 are in the OFF state, so that the input voltages of the two amplifier circuits, the charge control voltage and the discharge control voltage change in accordance with the comparison result voltage. In this manner, the drive control unit 3 outputs the charge control voltage and the discharge control voltage that are set to the respective initial levels in the setup period, and in the drive period, change in accordance with the comparison result voltage outputted from the voltage comparison unit 2.

The push-pull output unit 4 includes, as the switch for charge, the TFT 25 that charges the capacitive load 9, and includes, as the switch for discharge, the TFT 26 that discharges the capacitive load 9. The TFT 25 is controlled using the charge control voltage, and the TFT 26 is controlled using the discharge control voltage. Moreover, the switch for charge configures the charge circuit, and the switch for discharge configures the discharge circuit. The push-pull output unit 4 includes the charge circuit that drives the capacitive load 9 based on the charge control voltage, and the discharge circuit that drives the capacitive load 9 based on the discharge control voltage.

When the output voltage Vout is lower than the input voltage Vin, the comparison result voltage becomes higher than the inversion voltage Vm, and both of the input voltages of the two amplification circuits rise. At this time, the TFT 24 included in the charge-side amplifier circuit becomes in the ON state, and the charge control voltage falls so that the TFT 25 becomes in the ON state. On the other hand, since the TFT 21 included in the discharge-side amplifier circuit remains in the OFF state, the discharge control voltage does not change. Thus, in the push-pull output unit 4, the discharge circuit does not operate, and only the charge circuit operates. When the charge circuit operates, the capacitive load 9 is charged, and the output voltage Vout rises. The output voltage Vout rises until it becomes equal to the input voltage Vin.

When the output voltage Vout is higher than the input voltage Vin, the comparison result voltage becomes lower than the inversion voltage Vm, and both of the input voltages of the two amplifier circuits fall. At this time, the TFT 21 included in the discharge-side amplifier circuit becomes in the ON state, and the discharge control voltage rises so that the TFT 26 becomes in the ON state. On the other hand, since the TFT 24 included in the charge-side amplifier circuit remains in the OFF state, the charge control voltage does not change. Thus, in the push-pull output unit 4, the charge circuit does not operate, and only the discharge circuit operates. When the discharge circuit operates, the capacitive load 9 is discharged, and the output voltage Vout falls. The output voltage Vout falls until it becomes equal to the input voltage Vin.

In this manner, the drive control unit 3 selectively operates the charge circuit and the discharge circuit included in the push-pull output unit 4 so that the output voltage Vout becomes equal to the input voltage Vin. Specifically, in the setup period, the drive control unit 3 sets the charge control voltage and the discharge control voltage to levels at which the charge circuit and the discharge circuit do not operate, respectively, and in the drive period, based on the comparison result voltage, sets the charge control voltage to a level at which the charge circuit operates when the output voltage Vout is lower than the input voltage Vin, and sets the discharge control voltage to a level at which the discharge circuit operates when the output voltage Vout is higher than the input voltage Vin.

Hereinafter, effects of the buffer circuit 1 according to the present embodiment are described. As described above, in the buffer circuit 1, the charge circuit (TFT 25) and the discharge circuit (TFT 26) included in the push-pull output unit 4 are selectively operated, based on the result from comparing the input voltage Vin and the output voltage Vout, and thereby the charge and discharge of the capacitive load 9 are performed. Accordingly, the output voltage Vout can be made equal to the input voltage Vin.

Figure 9:
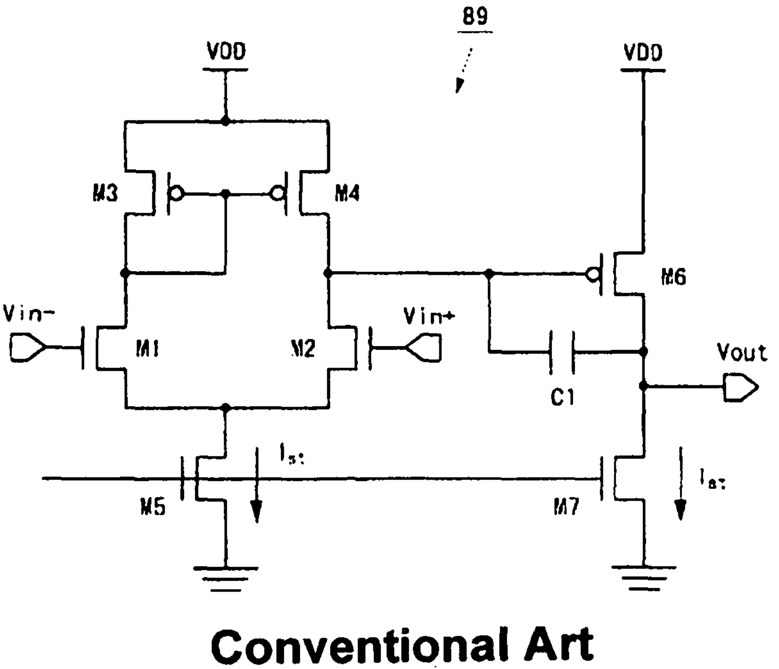
FIG. 9 is a circuit diagram showing one example of an operational amplifier included in the circuit shown in FIG. 8.

Moreover, selectively operating the charge circuit and the discharge circuit inhibits a steady current from flowing in the push-pull output unit 4. Accordingly, the power consumption in the buffer circuit 1 can be reduced. Moreover, since the charge circuit and the discharge circuit do not operate simultaneously, the charge or the discharge can be performed efficiently because no through current flows between power sources. Accordingly, as compared with the A class amplification circuit (the operational amplifier 89 shown in FIG. 9), a sufficient current drivability can be obtained and higher-speed charge and discharge can be performed by the smaller-sized TFTs. Moreover, in the buffer circuit 1, only when the output voltage Vout is not equal to the input voltage Vin, one of the charge circuit and the discharge circuit operates to charge or discharge the capacitive load 9. Accordingly, wasteful power consumption by the charge and discharge of the capacitive load 9 can be prevented. Moreover, the buffer circuit 1 can output the voltage VDD and the voltage VSS as the output voltage Vout (rail-to-rail operation). Accordingly, the operating voltage of the buffer circuit 1 can be made lower, so that the power consumption can be reduced.

Figure 7:
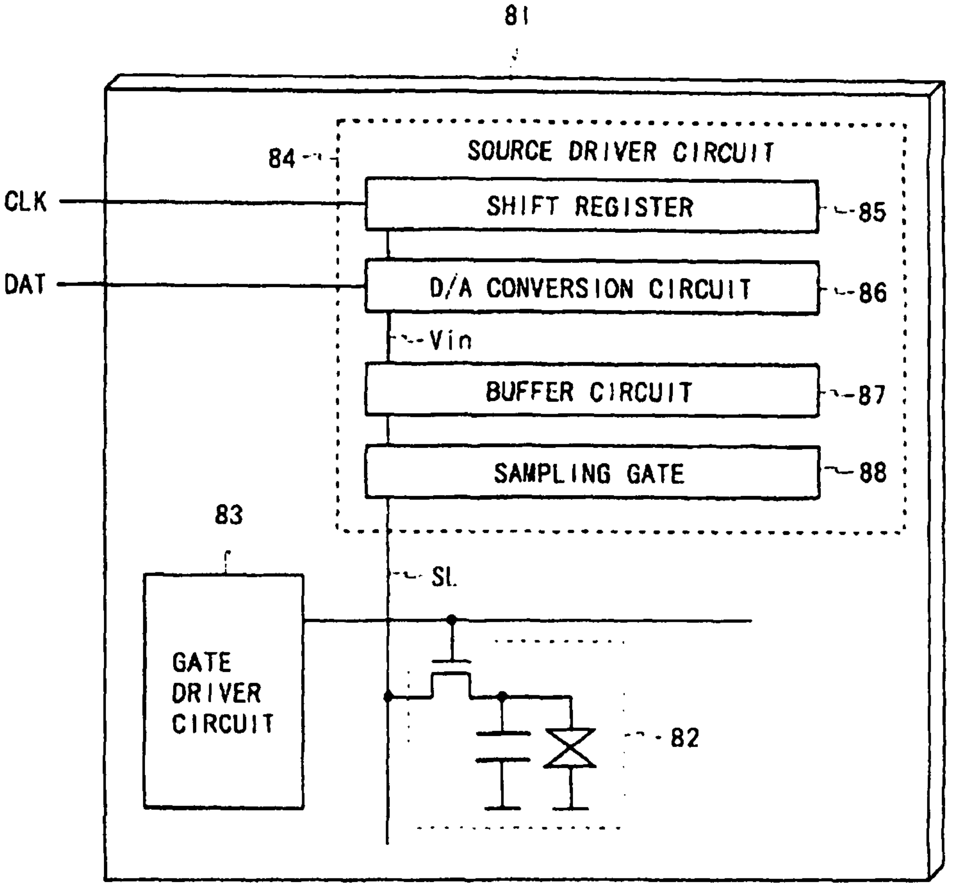
FIG. 7 is a block diagram showing a configuration of a conventional driver-integrated liquid crystal display device.
Figure 8:
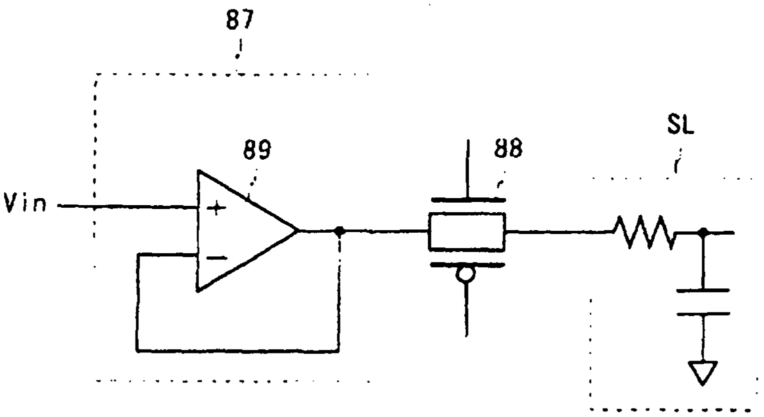
Conventional Art Fig. 8
FIG. 8 is a circuit diagram showing a part at subsequent stages of a D/A conversion circuit of the liquid crystal display device shown in FIG. 7.

Moreover, in the setup period, the output of the buffer circuit 1 is in the floating state where no connection is made, and in the drive period, it is controlled to be equal to the input voltage Vin. Thus, when the buffer circuit 1 is used to drive the source line SL in the driver-integrated liquid crystal display device (see FIG. 2), the sampling gate to make switching as to whether or not the source line SL is to be connected (the sampling gate 88 shown in FIG. 7) is not required. Accordingly, an area of the circuit can be reduced because the sampling gate, a control circuit thereof and the like are not provided. In a case where a period when the buffer circuit 1 and the source line SL are not connected (hereinafter, referred to as a non-connection period) and the setup period are controlled independently, different control signals may be supplied to the switches 11 and 13 and the switches 14 and 15. This allows the plurality of source lines SL to be driven on a time division basis. Moreover, for the voltage comparison unit 2, the drive control unit 3 and the push-pull output unit 4, the circuits robust against the process variation can be easily configured, as shown below.

The switches 11 and 12 are connected to an input terminal of the comparison circuit configured by the switch 13, the capacitor 31 and the inverter circuit 34, the other end of the switch 11 is connected to the input terminal IN, and the other end of the switch 12 is connected to the output terminal OUT, by which the voltage comparison unit 2 can be configured easily. In the setup period, the switch 11 is controlled to be in the ON state, and in the drive period, the switch 12 is controlled to be in the ON state, thereby enabling the voltage inputted to the comparison circuit to be switched between in the setup period and in the drive period. Moreover, the switch 13 is controlled to be in the ON state in the setup period, and is controlled to be in the OFF state in the drive period, by which the inverter circuit 34 outputs the voltage in accordance with the voltage (Vout−Vin+Vm) in the drive period. When the voltage outputted from the inverter circuit 34 is inputted to the drive control unit 3 as the comparison result voltage, the charge control voltage and the discharge control voltage outputted from the drive control unit 3 are not affected by the variation of a threshold voltage of the inverter circuit 34. Accordingly, the output voltage Vout can be made equal to the input voltage Vin without being affected by the variation of the threshold voltage of the inverter circuit 34.

The TFTs 23 and 24 configure the charge-side amplifier circuit, the TFTs 21 and 22 configure the discharge-side amplifier circuit, the inputs of the two amplifier circuits are capacitively-coupled to the output of the voltage comparison unit 2, respectively, and further for the inputs of the two amplifier circuits, the setup switches are provided respectively, by which the drive control unit 3 can be configured easily. In the setup period, the two setup switches are put into the ON state to supply the OFF voltage to the inputs of the amplifier circuits, by which the charge control voltage and the discharge control voltage can be set to initial levels, respectively. In the drive period, the two setup switches are put into the OFF state to supply the comparison result voltage through the capacitive elements to the inputs of the respective amplifier circuits, by which the charge control voltage and the discharge control voltage can be changed in accordance with the comparison result voltage. In this manner, setting the charge control voltage and the discharge control voltage to the initial levels in the setup period respectively allows the push-pull output unit 4 to be securely operated from the OFF state regardless of variation of the threshold voltages of the TFTs. Furthermore, in the drive period, since the state of the push-pull output unit 4 changes in one direction in accordance with the comparison result voltage, it does not happen in principle that both of the charge-side amplifier circuit and the discharge-side amplifier circuit simultaneously operate.

The TFT 25 is provided between the VDD line and the output terminal OUT, the TFT 26 is provided between the VSS line and the output terminal, and the gate terminal of the TFT 25 is connected to the output of the charge-side amplifier circuit (the drain terminals of the TFTs 23 and 24), the gate terminal of the TFT 26 is connected to the output of the discharge-side amplifier circuit (the drain terminals of the TFTs 21 and 22), by which the push-pull output unit 4 can be configured easily. Since the charge circuit and the discharge circuit included in the push-pull output unit 4 selectively operate, the push-pull output unit 4 does not operate like an analog circuit, in which the output voltage changes sensitively to the bias voltage, but turns on or off the operation like a digital circuit. In this manner, the push-pull output unit 4 has a circuit configuration in which an operation failure hardly occurs even if there is process variation.

As described above, the buffer circuit 1 according to the present embodiment has effects that it is small-sized, has low power consumption, and is robust against the process variation. Accordingly, when the source line is driven in the driver-integrated liquid crystal display device, using the buffer circuit 1 according to the present embodiment enables the small-sized liquid crystal display device having low power consumption and high image quality.

Figure 10:
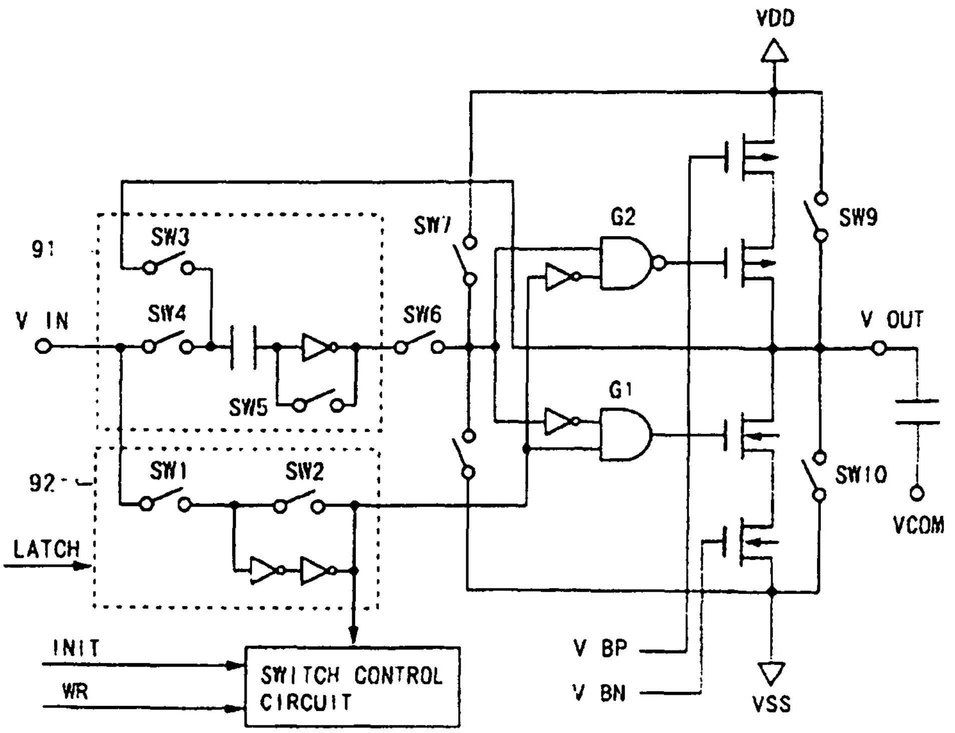
Conventional Art Fig. 10
FIG. 10 is a circuit diagram showing an output stage circuit of a source driver circuit described in a document.
Figure 11:
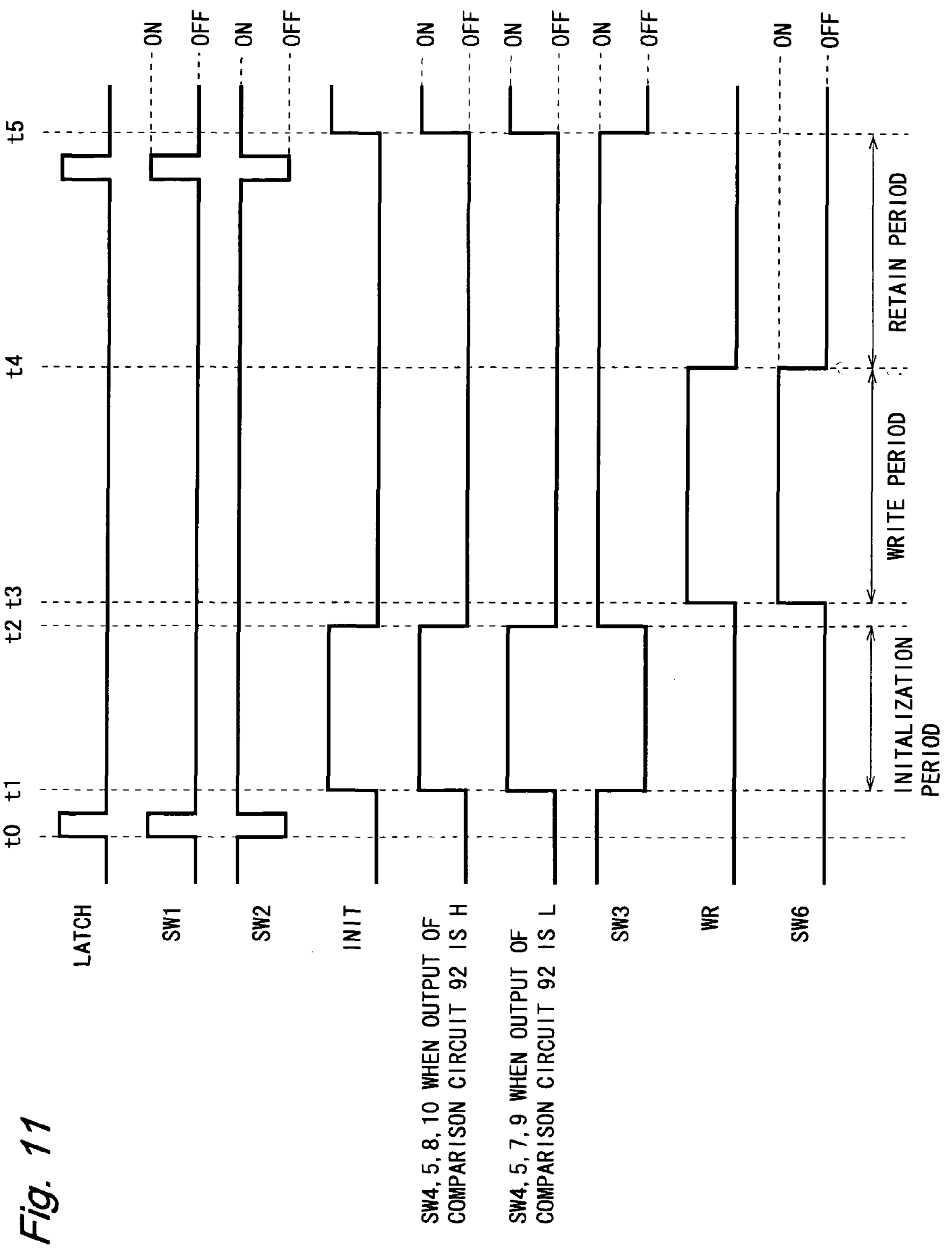
FIG. 11 is a timing chart of the output stage circuit shown in FIG. 10.

The buffer circuit 1 according to the present embodiment has the following advantages as compared with an output stage circuit shown in FIG. 10 (hereinafter, referred to as a conventional circuit). First, in the conventional circuit, the capacitive load is charged and discharged in the initialization period, and at this time, wasteful electric power is consumed. In contrast, in the buffer circuit 1, no initialization period is provided, and the charge and discharge of the capacitive load are performed in the drive period only to change the output voltage to the desired level. Accordingly, according to the buffer circuit 1, the power consumption can be made smaller than that of the conventional circuit.

Moreover, in the conventional circuit, if threshold voltages of inverter circuits included in comparison circuits 91 and 92 do not match threshold voltages of AND gates G1 and G2, an offset error occurs in the output voltage. On the other hand, in the buffer circuit 1, by using the above-described voltage comparison unit 2 and the drive control unit 3, the charge control voltage and the discharge control voltage not affected by the variation of the threshold voltage of the inverter circuit 34 can be generated, thereby making the output voltage Vout equal to the input voltage Vin without being affected by the process variation. Accordingly, the buffer circuit 1 is more robust against the process variation than the conventional circuit.

Moreover, in the conventional circuit, the circuit area becomes large because the AND gates G1 and G2 and the like are provided, and a control is complicated because the states of the switches SW7 to SW10 are switched in accordance with the output of the comparison circuit 92. On the other hand, in the buffer circuit 1, the AND gate and the like are not required, and the switches 11 to 15 only need to be supplied with the switch control signals Xs and Xd with a change pattern fixed. Accordingly, according to the buffer circuit 1, the circuit area can be made smaller than that of the conventional circuit.

Furthermore, in the conventional circuit, since only one of the charge and discharge is performed in the writing period, an offset error may occur in the output voltage by a delay inside the circuit. On the other hand, in the buffer circuit 1, since the charge and discharge are switched and performed as needed in the drive period, even if the output voltage is changed excessively by a delay inside the circuit (even if overshoot occurs), the output voltage changed excessively is immediately corrected automatically. Accordingly, according to the buffer circuit 1, the output voltage can be more precisely made equal to the input voltage.

Figure 6:
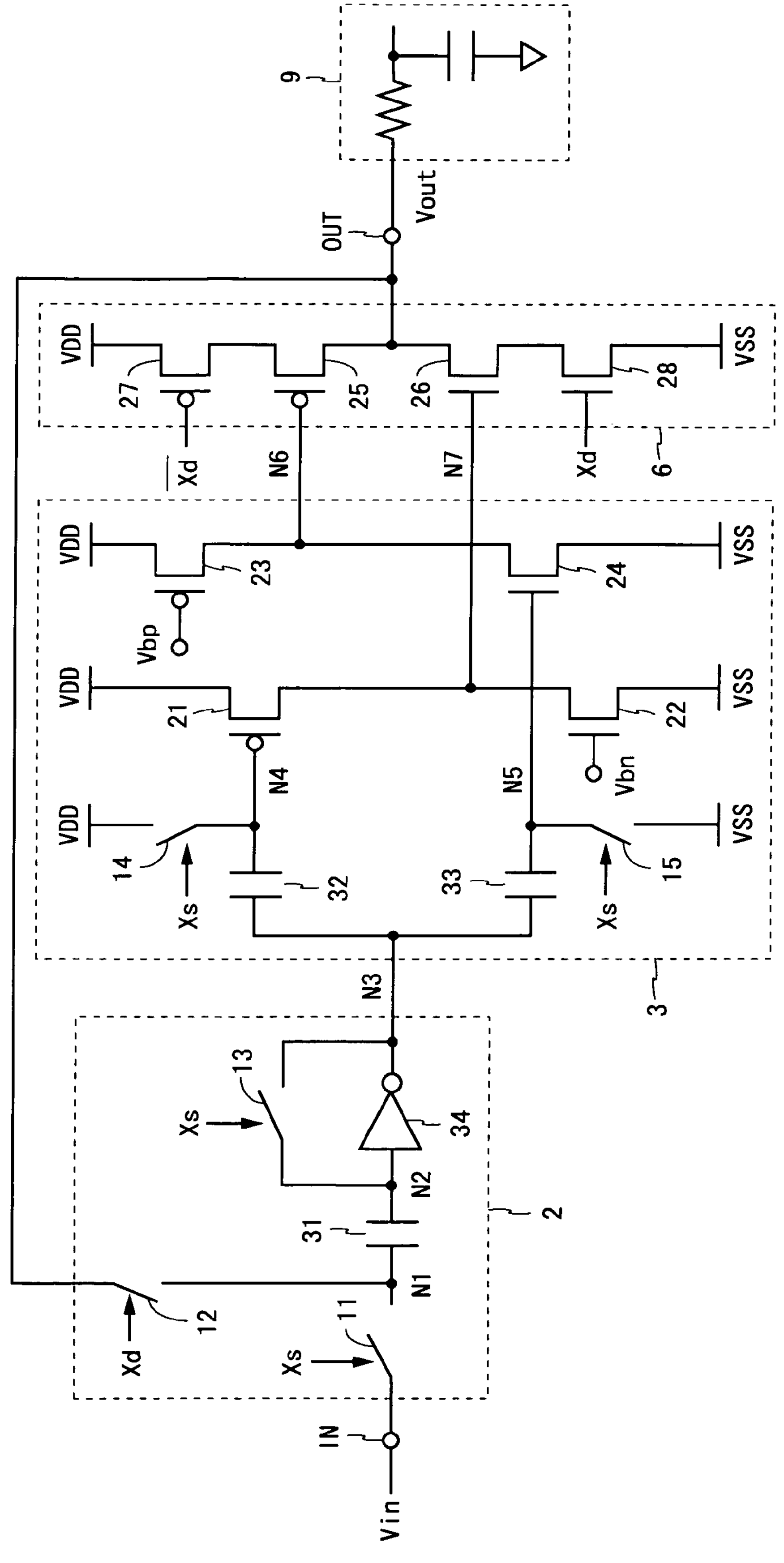
FIG. 6 is a circuit diagram of a push-pull type buffer circuit according to a modification of the embodiment of the present invention.

For the buffer circuit 1 according to the present embodiment, a modification described below can be configured. FIG. 6 is a circuit diagram of a push-pull type buffer circuit according to the modification of the embodiment of the present invention. In a buffer circuit 5 shown in FIG. 6, the push-pull output unit 4 in the above-described buffer circuit 1 is replaced by a push-pull output unit 6. The push-pull output unit 6 is obtained by adding a TFT 27 as a switch for charge stop, and an N type TFT 28 as a switch for discharge stop to the push-pull output unit 4.

In the buffer circuit 5, the TFT 27 is provided between the VDD line and the TFT 25, and the TFT 28 is provided between the VSS line and the TFT 26. More particularly, a source terminal of the TFT 27 is connected to the VDD line, and a drain terminal thereof is connected to a source terminal of the TFT 25. A source terminal of the TFT 28 is connected to the VSS line, and a drain terminal thereof is connected to a source terminal of the TFT 26. An inversion signal of the switch control signal Xd is applied to a gate terminal of the TFT 27, and the switch control signal Xd is applied to a gate terminal of the TFT 28.

In the drive period, since the switch control signal Xd is controlled to be at a high level, the TFTs 27 and 28 become in the ON state, so that the buffer circuit 5 operates similarly to the buffer circuit 1. On the other hand, in the setup period, since the switch control signal Xd is controlled to be at a low level, the TFTs 27 and 28 become in an OFF state. Thus, even when the TFTs 25 and 26 become in the ON state, the charge and discharge of the capacitive load 9 are not performed.

In this manner, the push-pull output unit 6 includes the TFT 27 provided in series with the TFT 25 between the VDD line and the output terminal OUT, and the TFT 28 provided in series with TFT 26 between the VSS line and the output terminal OUT, and the TFTs 27 and 28 are controlled to be in the ON state in the drive period. Accordingly, according to the buffer circuit 5, the period when the charge and discharge of the capacitive load 9 are performed is limited only to the drive period, which can prevent malfunction of the circuit. Moreover, since the non-connection period and the setup period can be controlled independently, the plurality of source lines SL can be driven on a time division basis. Specifically, the switch 12 and the push-pull output unit 6 are provided for each of the source lines SL, and the other circuits are shared among the plurality of source lines SL, which enables many source lines SL to be driven on a time division basis with a small circuit size.

The push-pull type buffer circuit of the present invention can be used in various embodiments as the capacitive load drive circuit that drives the capacitive load, based on the input voltage, in addition to the output stage circuit of the source driver circuit of the liquid crystal display device.

INDUSTRIAL AVAILABILITY

Since the capacitive load drive circuit of the present invention has a feature in that it is small-sized, has low power consumption, and is robust against process variation, it can be used in various manners in which the capacitive load is driven based on the input voltage, including the output stage circuit of the source driver circuit of the liquid crystal display device.

DESCRIPTION OF REFERENCE NUMBERALS

1 and 5: BUFFER CIRCUIT
2: VOLTAGE COMPARISON UNIT
3: DRIVE CONTROL UNIT
4 and 6: PUSH-PULL OUTPUT UNIT
9: CAPACITIVE LOAD
11 to 15: SWITCH
21 to 28 and 45: TFT
31 to 33: CAPACITOR
34: INVERTER CIRCUIT
40: LIQUID CRYSTAL DISPLAY DEVICE
41: LIQUID CRYSTAL PANEL
42: PIXEL CIRCUIT
43: GATE DRIVER CIRCUIT
44: SOURCE DRIVER CIRCUIT
46: SHIFT REGISTER
47: D/A CONVERSION CIRCUIT

The invention claimed is:

1. A capacitive load drive circuit that drives a capacitive load based on an input voltage, comprising:

a voltage comparison unit that compares the input voltage inputted from an input terminal and an output voltage outputted from an output terminal to output a comparison result voltage in accordance with a comparison result;

a drive control unit that outputs a charge control voltage and a discharge control voltage that are set to initial levels respectively in a first period, and change in accordance with the comparison result voltage in a second period; and a push-pull output unit including a charge circuit that charges the capacitive load connected to the output terminal, based on the charge control voltage, and a discharge circuit that discharges the capacitive load, based on the discharge control voltage, wherein the drive control unit includes:

a charge-side amplifier circuit that outputs the charge control voltage to the charge circuit;

a discharge-side amplifier circuit that outputs the discharge control voltage to the discharge circuit;

a charge-side capacitive element to capacitively-couple the output of the voltage comparison unit and an input of the charge-side amplifier circuit;

a discharge-side capacitive element to capacitively-couple the output of the voltage comparison unit and an input of the discharge-side amplifier circuit:

a charge-side setup switch that becomes in an ON state in the first period to supply an OFF voltage to the input of the charge-side amplifier circuit; and a discharge-side setup switch that becomes in an ON state in the first period to supply an OFF voltage to the input of the discharge-side amplifier circuit, wherein the drive control unit selectively operates the charge circuit and the discharge circuit so that the output voltage becomes equal to the input voltage, and wherein in the first period, the drive control unit sets the charge control voltage and the discharge control voltage to levels at which the charge circuit and the discharge circuit do not operate, respectively, and in the second period, based on the comparison result voltage, the drive control unit sets the charge control voltage to a level at which the charge circuit operates when the output voltage is lower than the input voltage, and sets the discharge control voltage to a level at which the discharge circuit operates when the output voltage is higher than the input voltage.

2. The capacitive load drive circuit according to claim 1, wherein the voltage comparison unit includes:

an input-side selection switch that is provided between the input terminal and a predetermined node, and becomes in an ON state in the first period;

an output-side selection switch that is provided between the output terminal and the node, and becomes in an ON state in the second period; and a comparison circuit whose input is connected to the node, the comparison circuit comparing the input voltage in the first period and the output voltage in the second period to output the comparison result voltage.

3. The capacitive load drive circuit according to claim 2, wherein the comparison circuit includes:

an inverter circuit;

a capacitive element provided between an input of the inverter circuit and the node; and a switch for short-circuit that is provided between the input and an output of the inverter circuit and becomes in an ON state in the first period, the capacitive element retains a difference between the input voltage and an inversion voltage of the inverter circuit in the first period, and in the second period, the inverter circuit outputs, as the comparison result voltage, a voltage in accordance with a voltage obtained by adding the inversion voltage to the difference between the output voltage and the input voltage.

4. The capacitive load drive circuit according to claim 1, wherein as the charge circuit, the push-pull output unit includes a switch for charge that is provided between a high voltage-side power supply line and the output terminal, and is controlled using the charge control voltage, and as the discharge circuit, the push-pull output unit includes a switch for discharge that is provided between a low voltage-side power supply line and the output terminal, and is controlled using the discharge control voltage.

5. The capacitive load drive circuit according to claim 4, wherein the push-pull output unit further includes:

a switch for charge stop that is provided between the high voltage-side power supply line and the output terminal in series with the switch for charge; and a switch for discharge stop that is provided between the low voltage-side power supply line and the output terminal in series with the switch for discharge.

6. A display device that drives a signal line connected to a pixel circuit using a capacitive load drive circuit according to claim 1.

* * * * *